(12) United States Patent
Fujimaru et al.

(10) Patent No.: US 9,591,768 B2
(45) Date of Patent: Mar. 7, 2017

(54) ADHESIVE AGENT HAVING A POLYIMIDE AND ACID MODIFIED ROSIN

(71) Applicant: TORAY INDUSTRIES, INC., Tokyo (JP)

(72) Inventors: Koichi Fujimaru, Otsu (JP); Toshihisa Nonaka, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 14/647,178

(22) PCT Filed: Dec. 4, 2013

(86) PCT No.: PCT/JP2013/082559
§ 371 (c)(1),
(2) Date: May 26, 2015

(87) PCT Pub. No.: WO2014/103637
PCT Pub. Date: Jul. 3, 2014

(65) Prior Publication Data
US 2015/0315436 A1 Nov. 5, 2015

(30) Foreign Application Priority Data
Dec. 27, 2012 (JP) .................................. 2012-283937

(51) Int. Cl.
*H05K 3/32* (2006.01)
*C09J 163/00* (2006.01)
*C09J 179/08* (2006.01)
*C09J 193/04* (2006.01)
*H01L 21/683* (2006.01)
*H05K 3/30* (2006.01)
*H01L 23/00* (2006.01)
*H05K 3/34* (2006.01)

(52) U.S. Cl.
CPC ............ *H05K 3/323* (2013.01); *C09J 163/00* (2013.01); *C09J 179/08* (2013.01); *C09J 193/04* (2013.01); *H01L 21/6836* (2013.01); *H01L 24/29* (2013.01); *H01L 24/32* (2013.01); *H01L 24/81* (2013.01); *H01L 24/83* (2013.01); *H01L 24/92* (2013.01); *H05K 3/305* (2013.01); *C09J 2479/083* (2013.01); *H01L 24/13* (2013.01); *H01L 24/27* (2013.01); *H01L 24/94* (2013.01); *H01L 2221/68327* (2013.01); *H01L 2224/131* (2013.01); *H01L 2224/13144* (2013.01); *H01L 2224/13147* (2013.01); *H01L 2224/27003* (2013.01); *H01L 2224/27334* (2013.01); *H01L 2224/27436* (2013.01); *H01L 2224/2919* (2013.01); *H01L 2224/2929* (2013.01); *H01L 2224/29387* (2013.01); *H01L 2224/32145* (2013.01); *H01L 2224/32225* (2013.01); *H01L 2224/73104* (2013.01); *H01L 2224/81191* (2013.01); *H01L 2224/81203* (2013.01); *H01L 2224/81907* (2013.01); *H01L 2224/8385* (2013.01); *H01L 2224/83132* (2013.01); *H01L 2224/83191* (2013.01); *H01L 2224/83192* (2013.01); *H01L 2224/83193* (2013.01); *H01L 2224/83203* (2013.01); *H01L 2224/83862* (2013.01); *H01L 2224/83907* (2013.01); *H01L 2224/83948* (2013.01); *H01L 2224/9211* (2013.01); *H01L 2224/94* (2013.01); *H01L 2924/01008* (2013.01); *H01L 2924/01014* (2013.01); *H01L 2924/0665* (2013.01); *H01L 2924/07025* (2013.01); *H01L 2924/15787* (2013.01); *H01L 2924/15788* (2013.01); *H05K 3/3436* (2013.01); *H05K 3/3489* (2013.01); *H05K 2201/0154* (2013.01); *H05K 2201/10977* (2013.01); *Y02P 70/613* (2015.11)

(58) Field of Classification Search
CPC . H01L 24/26; H01L 23/3142; H01L 21/6836; H01L 24/29; H01L 24/32; H01L 24/81; H01L 24/83; H01L 24/92; H05K 3/323; H05K 3/305; C09J 163/00; C09J 179/08; C09J 193/04
See application file for complete search history.

(56) References Cited

U.S. PATENT DOCUMENTS

| | | | |
|---|---|---|---|
| 2004/0132888 A1 | 7/2004 | Naiki et al. | |
| 2004/0213973 A1* | 10/2004 | Hara | C08F 210/02 428/212 |
| 2006/0014871 A1 | 1/2006 | Toriumi et al. | |
| 2007/0098995 A1 | 5/2007 | Masuko et al. | |
| 2009/0123747 A1 | 5/2009 | Fujimaru et al. | |
| 2010/0255241 A1 | 10/2010 | Wada et al. | |
| 2012/0129988 A1* | 5/2012 | Fujimaru | C09J 163/00 524/114 |

FOREIGN PATENT DOCUMENTS

| | | |
|---|---|---|
| JP | 2000-144082 A | 5/2000 |
| JP | 2004-211064 A | 7/2004 |
| JP | 2004-319823 A | 11/2004 |
| JP | 2006-144022 A | 6/2006 |
| JP | 2008-94870 A | 4/2008 |
| WO | WO 00/29500 A1 | 5/2000 |
| WO | WO 2006/132165 A1 | 12/2006 |

OTHER PUBLICATIONS

International Search Report, issued in PCT/JP2013/082559, dated Mar. 4, 2014.
Chinese Office Action for Chinese Application No. 201380068190.4, dated Mar. 16, 2016, with an English translation.
Singaporean Search Report and Written Opinion for Singaporean Application No. 11201505053X, dated Apr. 7, 2016.

* cited by examiner

*Primary Examiner* — Alonzo Chambliss
(74) *Attorney, Agent, or Firm* — Birch, Stewart, Kolasch & Birch, LLP

(57) ABSTRACT

The present invention relates to an adhesive agent which can be used in the mounting of a semiconductor chip on a circuit board or the like. The present invention addresses the problem of providing an adhesive agent having both excellent storage stability and excellent connection reliability. A means for solving the problem is an adhesive agent comprising (a) a polyamide, (b) an epoxy compound and (c) an acid-modified rosin.

8 Claims, No Drawings

ADHESIVE AGENT HAVING A POLYIMIDE AND ACID MODIFIED ROSIN

TECHNICAL FIELD

The present invention relates to an adhesive agent which is used in bonding or direct electrical connection of a semiconductor chip such as LSI, LED or laser diode to a circuit board such as a flexible substrate, a glass epoxy substrate, a glass substrate, a ceramic substrate or a silicon interposer, or in bonding or lamination between semiconductor chips.

BACKGROUND ART

In recent years, flip chip assembly has received attention and has been rapidly spreading as a technique for mounting a semiconductor chip on a circuit board associated with downsizing and density growth of semiconductor devices. In flip chip assembly, an epoxy resin-based adhesive agent is generally interposed between a semiconductor chip and a circuit board to ensure the connection reliability of joints between bump electrodes formed on the semiconductor chip and pad electrodes of the circuit board. Particularly, adhesive agents containing a polyimide resin, an epoxy resin, and inorganic particles are being frequently used for various applications such as electrical and electronic applications, architecture, automobiles, and airplanes by virtue of the heat resistance and insulation properties of the polyimide resin, the adhesiveness and water resistance of the epoxy resin, and the low water absorbency and low thermal expansibility of the inorganic particles (for example, Patent Documents 1 to 3).

Further, when metal electrodes of the semiconductor chip and the circuit board are solder welded, a flux material is used. A main function of the flux material is to make a solder joint clean, to prevent oxidation of a metal, and to enhance solder wettability. As the flux material, rosin-based materials are known (e.g., Patent Documents 4 and 5).

PRIOR ART DOCUMENTS

Patent Documents

Patent Document 1: Japanese Patent Laid-open Publication No. 2004-319823
Patent Document 2: JP 3995022 B1
Patent Document 3: Japanese Patent Laid-open Publication No. 2009-277818
Patent Document 4: Japanese Patent Laid-open Publication No. 2001-219294
Patent Document 5: Japanese Patent Laid-open Publication No. 2005-059028

SUMMARY OF THE INVENTION

Problems to be Solved by the Invention

In the case of a conventional adhesive agent, in flip chip assembly, a hardening reaction proceeds gradually due to heating for removing a water content by moisture absorption or heating in a semiconductor chip assembly process, and therefore there is a case where unstable electrical connection is caused because bump electrodes of a semiconductor chip are less likely to penetrate the adhesive agent or there is a case where connection reliability is poor because air bubbles are trapped in the adhesive agent. Further, there is a case where the adhesive agent is fluidized due to the aforementioned heating and becomes irregular in its thickness to cause poor connection reliability. Moreover, a semiconductor device produced using such a conventional adhesive agent also has a problem in that it may be difficult to maintain sufficient connection reliability when the semiconductor device is subjected to a process where higher durability is required such as a moisture absorption-reflow process or a thermal cycle process.

In order to solve these problems, it is an object of the present invention to provide an adhesive agent which has excellent storage life in heating conditions of a heat-drying process and an assembly process.

Solutions to the Problems

The present invention pertains to an adhesive agent comprising a polyimide (a), an epoxy compound (b), and an acid-modified rosin (c).

Effects of the Invention

According to the present invention, an adhesive agent is provided which has excellent stability against heating treatment during a heat-drying process and an assembly process.

EMBODIMENTS OF THE INVENTION

The adhesive agent of the present invention is an adhesive agent comprising a polyimide (a), an epoxy compound (b), and an acid-modified rosin (c).

The adhesive agent of the present invention contains the polyimide (a), and is therefore excellent in heat resistance and chemical resistance. Particularly, a hardened article having a higher-density network structure can be obtained by using a polyimide having, in its side chain, at least one highly polar functional group selected from the group consisting of a phenolic hydroxyl group, a sulfonic acid group, and a thiol group since the solubility in an organic solvent and the compatibility with an epoxy resin of polyimide are improved and a ring-opening reaction of the epoxy compound and an addition reaction to another organic-solvent-soluble polyimide are accelerated during heat treatment. A method for synthesizing such a polyimide is not limited to the following examples, and an example thereof is a method in which a diamine having a highly polar functional group such as a phenolic hydroxyl group, a sulfonic acid group, and a thiol group is first reacted with an acid dianhydride to synthesize a polyimide precursor, and then the polyimide precursor is subjected to end modification using a primary monoamine as a terminal blocking agent, and is then subjected to heat treatment at 150° C. or higher to perform polyimide cyclization. Alternatively, the following method may be used. An acid dianhydride is reacted with a primary monoamine as a terminal blocking agent in advance, and then a diamine having a functional group is added to synthesize an end-modified polyimide precursor, and the polyimide precursor is subjected to heat treatment at a high temperature of 150° C. or higher to perform polyimide cyclization.

It is to be noted that the polyimide (a) used in the present invention is desirably an organic-solvent-soluble polyimide which is dissolved in at least one solvent selected from the following solvents in an amount of 20 mass % or more at 23° C. since the coating properties of the resulting adhesive agent varnish are enhanced. Examples of the solvents include ketone-based solvents such as acetone, methyl ethyl ketone, methyl isobutyl ketone, cyclopentanone, and cyclohexanone; ether-based solvents such as 1,4-dioxane, tetrahydrofuran, and diglyme; glycol ether-based solvents such as methyl cellosolve, ethyl cellosolve, propylene glycol monomethyl ether, propylene glycol monoethyl ether, propylene glycol monobutyl ether, and diethylene glycol methyl ethyl ether; and other solvents such as benzyl alcohol, N-methylpyrrolidone, γ-butyrolactone, ethyl acetate, and N,N-dimethylformamide.

A preferred example of the polyimide (a) is a polymer having a structure represented by a general formula (2) or a general formula (3) and containing a structure represented by a general formula (1) in an amount of 5 to 15% by mass with respect to the total amount of the polymer as $R^4$ in the general formula (2) or the general formula (3). By setting the content of a structure represented by the general formula (1) contained in the polymer to 5% by mass or more, it is possible to impart solubility in an organic solvent and appropriate flexibility to a polyimide. By setting the content to 15% by mass or less, it is possible to maintain the rigidity of a polyimide and secure heat resistance and insulation properties.

It is to be noted that the total amount of the polymer (polyimide) obtained by synthesis of the polyimide refers to the weight of a polymer obtained by polymerization using a diamine, an acid dianhydride, and a terminal blocking agent as its constituents. The total amount of the polyimide does not include the weights of an excess of the diamine, an excess of the acid dianhydride, and an excess of the terminal blocking agent which have been fed during synthesis but not polymerized to a polymer.

[Chem. 1]

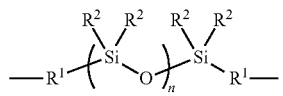
(1)

In the above formula, $R^1$s represent a divalent hydrocarbon group, and may be the same or different in one molecule and may be the same or different in different molecules. In the above formula, $R^2$s represent a monovalent hydrocarbon group, and may be the same or different in one molecule and may be the same or different in different molecules. n is an integer of 1 to 10.

$R^1$ is preferably an alkylene group or a phenylene group having 1 to 5 carbon atoms. $R^2$ is preferably an alkyl group or a phenyl group having 1 to 5 carbon atoms. Further, n is preferably 1 to 2. By setting n to 1 or more, it is possible to suppress the shrinkage of the adhesive agent during hardening. By setting n to 10 or less, it is possible to improve the insulation properties and heat resistance of the adhesive agent without reducing the imide group content of the polyimide skeleton.

[Chem. 2]

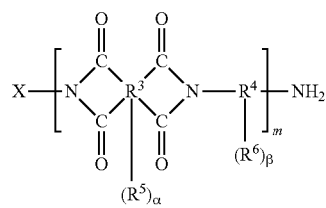
(2)

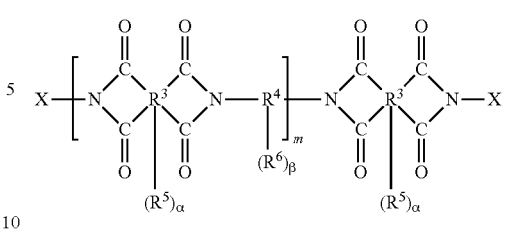
(3)

In the above formula, $R^3$s are a 4- to 14-valent organic group, and may be the same or different in one molecule and may be the same or different in different molecules. $R^4$s are a 2- to 12-valent organic group, and may be the same or different in one molecule and may be the same or different in different molecules. At least one of $R^3$ and $R^4$ is an aromatic group containing at least one of one or more groups selected from the group consisting of a 1,1,1,3,3,3-hexafluoropropyl group, an isopropyl group, an ether group, a thioether group, and a $SO_2$ group. $R^5$s and $R^6$s represent one or more groups selected from the group consisting of a phenolic hydroxyl group, a sulfonic acid group, and a thiol group, and may be the same or different in one molecule and may be the same or different in different molecules. X represents a monovalent organic group. m is an integer of 8 to 200. α and β each represent an integer of 0 to 10 and α+β is within the range of 0 to 10. However, in a repeating unit in the formula, α+β is 1 to 10 in 20 to 90 mol % of repeating units whose number is denoted by m.

In addition, hereinafter, the group selected from the group consisting of a 1,1,1,3,3,3-hexafluoropropyl group, an isopropyl group, an ether group, a thioether group, and a $SO_2$ group is referred to as "specific group".

In the general formulas (2) and (3), $R^3$ represents a structural component of an acid dianhydride and is preferably a 4- to 14-valent organic group having 5 to 40 carbon atoms, $R^4$ represents a structural component of a diamine and is preferably a 2- to 12-valent organic group having 5 to 40 carbon atoms, and each of $R^3$ and $R^4$ preferably contains at least one of the specific groups.

$R^5$ is a substituent of $R^3$, and is selected from the group consisting of a phenolic hydroxyl group, a sulfonic acid group, and a thiol group. $R^5$ is derived from a substituent of the acid dianhydride serving as a raw material. $R^6$ is a substituent of $R^4$, and is selected from the group consisting of a phenolic hydroxyl group, a sulfonic acid group, and a thiol group. $R^6$ is derived from a substituent of the diamine serving as a raw material.

An acid dianhydride to be used will be described. Specific examples of the acid dianhydride having at least one of the specific groups include 2,2-bis(3,4-dicarboxyphenyl)propane dianhydride, 2,2-bis(2,3-dicarboxyphenyl)propane dianhydride, bis(3,4-dicarboxyphenyl)sulfonic dianhydride, bis(3,4-dicarboxyphenyl)ether dianhydride, 2,2-bis(3,4-dicarboxyphenyl)hexafluoropropane dianhydride, and compounds obtained by substituting hydrogen atoms on the aromatic rings of the above-mentioned compounds with alkyl groups or halogen atoms.

A specific example of the acid dianhydride having at least one of the specific groups and at least one group selected from the group consisting of a phenolic hydroxyl group, a sulfonic acid group, and a thiol group is an aromatic acid dianhydride having the following structure:

[Chem. 3]

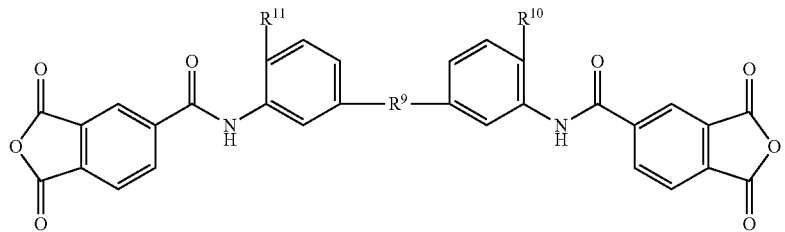

wherein $R^9$ represents $C(CF_3)_2$, $C(CH_3)_2$, $SO_2$, S or O, and $R^{10}$ and $R^{11}$ are each a hydrogen atom, a hydroxyl group, a thiol group, or a sulfonic acid group, provided that $R^{10}$ and $R^{11}$ are not hydrogen atom at the same time.

A specific example of the acid dianhydride having no specific group but having at least one group selected from the group consisting of a phenolic hydroxyl group, a sulfonic acid group, and a thiol group is an aromatic acid dianhydride having the following structure:

[Chem. 4]

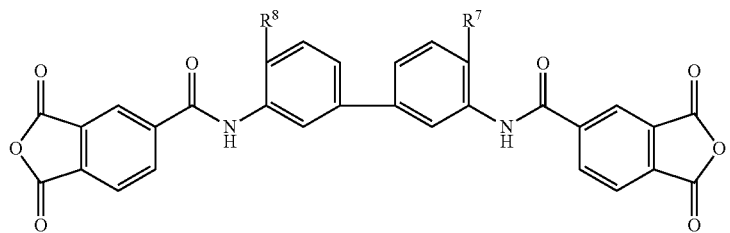

wherein $R^7$ and $R^8$ are each a hydrogen atom, a hydroxyl group, a thiol group, or a sulfonic acid group, provided that $R^7$ and $R^8$ are not hydrogen atom at the same time.

Specific examples of the acid dianhydride having neither a specific group nor a group selected from among a phenolic hydroxyl group, a sulfonic acid group, and a thiol group include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,2,5,6-naphthalenetetracarboxylic dianhydride, 2,3,6,7-naphthalenetetracarboxylic dianhydride, 2,3,5,6-pyridinetetracarboxylic dianhydride, and 3,4,9,10-perylenetetracarboxylic dianhydride, and compounds obtained by substituting hydrogen atoms on the aromatic rings of the above-mentioned compounds with alkyl groups or halogen atoms.

In the present invention, these acid dianhydrides may be used singly or in combination of two or more thereof.

Next, a diamine will be described. Specific examples of the diamine having at least one of the specific groups include 3,4'-diaminodiphenyl sulfide, 4,4'-diaminodiphenyl sulfide, 3,4'-diaminodiphenyl ether, 4,4'-diaminodiphenyl ether, 3,4'-diaminodiphenyl sulfone, 4,4'-diaminodiphenyl sulfone, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 1,3-bis(4-aminophenoxy)benzene, 2,2-bis[4-(4-aminophenoxy)phenyl]hexafluoropropane, and 2,2-bis[4-(4- aminophenoxy)phenyl]propane, and compounds obtained by substituting hydrogen atoms on the aromatic rings of the above-mentioned compounds with alkyl groups or halogen atoms.

Specific examples of the diamine having at least one of the specific groups and at least one group selected from the group consisting of a phenolic hydroxyl group, a sulfonic acid group, and a thiol group include: 2,2-bis(3-amino-4-hydroxyphenyl)hexafluoropropane, 2,2-bis(3-hydroxy-4-aminophenyl)hexafluoropropane, 2,2-bis(3-amino-4-hydroxyphenyl)propane, 2,2-bis(3-hydroxy-4-aminophenyl)propane, 3,3'-diamino-4,4'-dihydroxydiphenyl ether, 3,3'-diamino-4,4'-dihydroxydiphenylsulfone, 3,3'-diamino-4,4'-dihydroxydiphenylsulfide, compounds obtained by substituting hydrogen atoms on the aromatic rings of the above-mentioned compounds with alkyl groups or halogen atoms, and diamines having the following structures:

[Chem. 5]

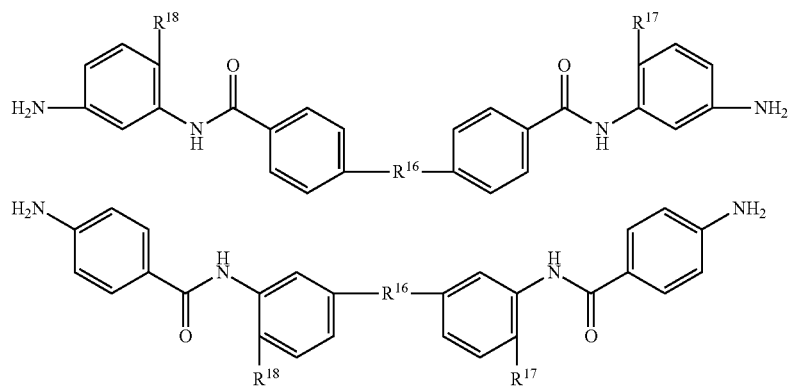

wherein $R^{16}$ represents $C(CF_3)_2$, $C(CH_3)_2$, $SO_2$, S or O, $R^{17}$ and $R^{18}$ are each a hydrogen atom, a hydroxyl group, a thiol group, or a sulfonic acid group, provided that $R^{17}$ and $R^{18}$ are not hydrogen atom at the same time.

Specific examples of the diamine having no specific group but having at least one group selected from the group consisting of a phenolic hydroxyl group, a sulfonic acid group, and a thiol group include 3,3'-diamino-4,4'-dihydroxybiphenyl, 2,4-diamino-phenol, 2,5-diaminophenol, 1,4-diamino-2,5-dihydroxybenzene, diaminodihydroxypyrimidine, diaminodihydroxypyridine, hydroxydiaminopyrimidine, 9,9-bis(3-amino-4-hydroxyphenyl) fluorene, compounds obtained by substituting hydrogen atoms on the aromatic rings of the above-mentioned compounds with alkyl groups or halogen atoms, and diamines having the following structures:

[Chem. 6]

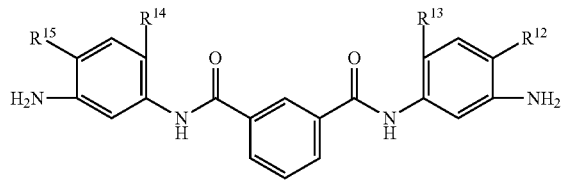

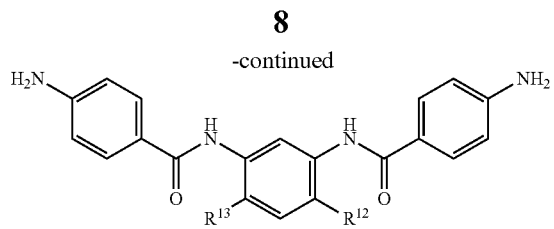

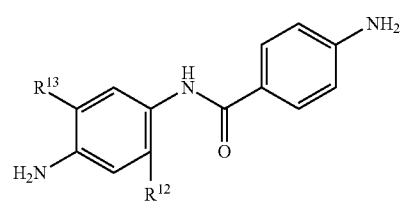

-continued

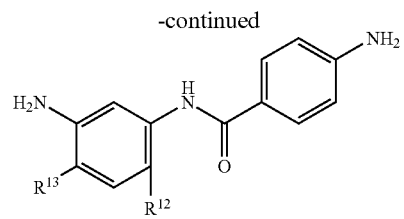

wherein $R^{12}$ to $R^{15}$ are each a hydrogen atom, a hydroxyl group, a thiol group, or a sulfonic acid group, provided that $R^{12}$ and $R^{13}$ are not hydrogen atom at the same time.

Specific examples of the diamine having neither a specific group nor a group selected from among a phenolic hydroxyl group, a sulfonic acid group, and a thiol group include 3,4'-diaminodiphenylmethane, 4,4'-diaminodiphenylmethane, benzidine, m-phenylenediamine, p-phenylenediamine, 1,5-naphthalenediamine, 2,6-naphthalenediamine, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2'3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, compounds obtained by substituting hydrogen atoms on the aromatic rings of the above-mentioned compounds with alkyl groups or halogen atoms, terephthalic hydrazide, isophthalic hydrazide, phthalic hydrazide, 2,6-naphthalenedicarboxylic dihydrazide, 4,4'-bisphenyl dicarbonohydrazine, 4,4'-cyclohexane dicarbonohydrazine, and hydrazide compounds obtained by substituting hydrogen atoms on the aromatic rings of the above-mentioned compounds with alkyl groups or halogen atoms. These diamines may be used singly or in combination of two or more thereof.

Further, a structure represented by the general formula (1) is included as $R^4$ in the general formulas (2) and (3), and is therefore a constituent of a diamine. Examples of the diamine containing a structure represented by the general formula (1) include bis(3-aminopropyl)tetramethyldisiloxane, bis(p-amino-phenyl)octamethylpentasiloxane and the like.

The rate of the reaction between the polyimide and the epoxy compound during heat treatment of the adhesive agent can be controlled by selecting $R^5$ and $R^6$ in the general formulas (2) and (3), and thereby, the cross-linking density of a hardened article of the adhesive agent can be adjusted. This makes it possible to impart necessary heat resistance and chemical resistance to the hardened article of the adhesive agent. $\alpha$ and $\beta$ each represent an integer of 0 to 10 and $\alpha+\beta$ is within the range of 0 to 10. However, in a repeating unit in the formula, $\alpha+\beta$ is 1 to 10 in 20 to 90 mol % of repeating units whose number is denoted by m. Further, 20 to 90 mol % of the total of $R^5$s and $R^6$s are preferably groups selected from the group consisting of phenolic hydroxyl groups, sulfonic acid groups, and thiol groups. By setting the ratio of these groups to the total of $R^5$s and $R^6$s to 20 mol % or more, it is possible to improve the solubility of the adhesive agent before hardening in an organic solvent, and the chemical resistance and heat resistance of the hardened article of the adhesive agent, and by setting the ratio to 90 mol % or less, it is possible to suppress the cross-linking density of the hardened article of the adhesive agent within an appropriate range to maintain the elongation and toughness of an adhesive agent film after hardening.

In the general formulas (2) and (3), X represents a monovalent organic group and is a residue of a primary monoamine which is a terminal blocking agent. Herein, examples of the primary monoamine include an aliphatic monoamine, an alicyclic monoamine, and an aromatic monoamine. Among them, an aromatic monoamine is preferred in point of enhancing heat resistance of the polyimide. These monoamines may be used singly or in a combination of two or more thereof. Specific examples of the primary monoamine include 5-aminoquinoline, 4-aminoquinoline, 3-aminonaphthalene, 2-aminonaphthalene, 1-aminonaphthalene, and aniline. Among them, aniline is preferably used.

As the primary monoamine, one not having another substituent which reacts with the epoxy compound is preferably used. This makes it possible to obtain an organic-solvent-soluble polyimide not having a substituent, which reacts with the epoxy compound, at the end of the polyimide having high molecular mobility. The use of such an organic-solvent-soluble polyimide makes it possible to suppress the progress of the reaction between the organic-solvent-soluble polyimide and the epoxy compound at room temperature to enhance the storage life of the adhesive agent.

The ratio of the X component shown in the general formulas (2) and (3) to be introduced is preferably 0.1 to 60 mol, and particularly preferably 5 to 50 mol with respect to 100 mol of the total diamine residue contained in the polyimide on the primary monoamine equivalent basis, the primary monoamine being an X's original component and the terminal blocking agent.

In the general formulas (2) and (3), m represents the repeating number of the polymer, and is an integer of 8 or more and 200 or less. m is preferably an integer of 10 to 150.

With respect to a molecular weight, the polystyrene equivalent weight average molecular weight of the polyimide as measured by gel filtration chromatography is preferably 4,000 to 80,000, particularly preferably 8,000 to 60,000. By setting m to 8 or more, it is possible to increase the viscosity of the resulting adhesive agent varnish to enable a thick coating, and by setting m to 200 or less, it is possible to improve the solubility of the polyimide in a solvent. Here, a measurement method of the weight average molecular weight of the polyimide will be exemplified below. A polyimide solution having a solid concentration of 0.1% by mass is prepared by dissolving the polyimide in N-methyl-pyrrolidone (NMP), and the polystyrene equivalent weight average molecular weight is calculated using the polyimide solution and a GPC apparatus Waters 2690 (manufactured by Waters Corporation). GPC measurement is performed using NMP containing 0.05 mol/L of LiCl and 0.05 mol/L of phosphoric acid dissolved therein as a mobile phase at a developing speed of 0.4 mL/min. A GPC measurement system used includes, for example, the following.

Detector: Waters 996
System controller: Waters 2690
Column oven: Waters HTR-B
Thermo controller: Waters TCM
Columns: TOSOH guard column
Columns: TOSOH TSK-GEL $\alpha$-4000
Columns: TOSOH TSK-GEL $\alpha$-2500

The polyimide (a) to be used for the present invention may be a polyimide composed of only structures represented by the general formulas (2) and (3), a copolymer having another structure as a copolymerization component in addition to structures represented by the general formulas (2) and (3), or a mixture thereof. Further, a polyimide having another structure may be additionally mixed in addition to these polyimides. In this case, the polyimide having structures represented by the general formulas (2) and (3) is preferably contained in an amount of 50 mol % or more with respect to the total polyimide. The type and amount of the structure used for copolymerization or mixing are preferably selected to an extent not impairing the heat resistance of a heat resistant resin obtained by heat treatment.

The polyimide (a) is synthesized by a publicly known method by substituting part of a diamine with a terminal blocking agent which is a monoamine or by substituting part of an acid dianhydride with a terminal blocking agent which is a monocarboxylic acid, an acid anhydride, a monoacid chloride compound, or a monoactive ester compound. For example, a polyimide precursor is obtained by a method in which a tetracarboxylic dianhydride is reacted with a diamine compound (part of which is substituted with a terminal blocking agent that is a monoamine) at a low temperature, a method in which a tetracarboxylic dianhydride (part of which is substituted with a terminal blocking agent that is an acid anhydride, a monoacid chloride compound, or a monoactive ester compound) is reacted with a diamine compound at a low temperature, a method in which a diester is obtained by the reaction between a tetracarboxylic dianhydride and an alcohol and is then reacted with a diamine (part of which is substituted with a terminal blocking agent that is a monoamine) in the presence of a condensing agent, or a method in which a diester is obtained by the reaction between a tetracarboxylic dianhydride and an alcohol and then the residual dicarboxylic acid is acid-chlorinated and reacted with a diamine (part of which is substituted with a terminal blocking agent that is a monoamine). Subsequently, the polyimide precursor is subjected to imide ring closure by a publicly known method and thereby, a polyimide can be synthesized.

A structure represented by the general formula (1) introduced into the polymer and a structure derived from a terminal blocking agent can be easily detected and quantitatively analyzed in the following manner. For example, a polymer into which a structure represented by the general formula (1) and a terminal blocking agent have been introduced is dissolved in an acidic solution or a basic solution to decompose it into a diamine component and an acid anhydride component which are constituent units of the polymer, and the resulting decomposed product was measured by using gas chromatography (GC) or NMR, and thereby, the structure represented by the general formula (1) and the terminal blocking agent used can be easily detected and quantitatively analyzed. Alternatively, also when a polyimide into which a terminal blocking agent has been introduced is directly subjected to pyrolysis gas chromatography (PGC) or infrared spectral measurement and $^{13}$CNMR spectral measurement, the structure represented by the general formula (1) and the terminal blocking agent used can be easily detected and quantitatively analyzed.

The content of the polyimide (a) in the adhesive agent is preferably 15 to 90 parts by mass with respect to 100 parts by mass of the epoxy compound (b), and is more preferably 30 to 70 parts by mass from the viewpoint of the reaction with the epoxy compound to form a high-density network structure. When the content of the polyimide (a) is 15 parts by mass or more, heat resistance is more improved. On the other hand, when the content of the polyimide (a) is 90 parts by mass or less, the adhesive agent becomes lower in water absorption, and therefore foaming in hardening the adhesive agent by heating can be more suppressed, and for example, a reduction of the adhesive force between a circuit board and a semiconductor chip is more reduced, and connection reliability is more improved.

The adhesive agent of the present invention contains the epoxy compound (b). The epoxy compound (b) reacts with a phenolic hydroxyl group, a sulfonic acid group, or a thiol group in the acid-modified rosin (c) or the polyimide side chain to form a hardened article having a high-density network structure, and therefore the resulting hardened adhesive agent exhibits resistance to various chemicals. Thereby, the resistance of the adhesive agent to various solvents, especially to N-methylpyrrolidone can be increased. Further, since the epoxy compound is generally hardened by a ring-opening reaction accompanied by no shrinkage, it becomes possible to reduce the shrinkage of the adhesive agent during hardening. As the epoxy compound (b), an epoxy compound having two or more epoxy groups or an epoxy compound having an epoxy equivalent of 100 to 500 is preferably used. By setting the epoxy equivalent to 100 or more, the toughness of the hardened adhesive agent can be increased. By setting the epoxy equivalent to 500 or less, it is possible to allow the hardened adhesive agent to have a high-density network structure and excellent electrical insulation properties.

The epoxy compound (b) contains both of a liquid epoxy compound and a solid epoxy compound, and the liquid epoxy compound content is preferably 20% by mass or more and 70% by mass or less, and more preferably 30% by mass or more and 60% by mass or less with respect to the total amount of the epoxy compound. When the adhesive agent contains the liquid epoxy compound in an amount of a value within the above range, the adhesive agent can have appropriate plasticity and flexibility as an adhesive agent for semiconductors.

Herein, the liquid epoxy compound refers to one having a viscosity of 150 Pa·s or less at a temperature of 25° C. and a pressure of $1.013 \times 10^3$ N/m$^2$, and the solid epoxy compound refers to one having a viscosity exceeding 150 Pa·s at a temperature of 25° C. Examples of the liquid epoxy compound include, but are not limited to, JER (registered trademark) 828, JER (registered trademark) 1750, JER (registered trademark) 152, JER (registered trademark) 630, and YL 980 (trade names, manufactured by Mitsubishi Chemical Corporation) and EPICLON (registered trademark) HP-4032 (trade name, manufactured by DIC CORPORATION). These liquid epoxy compounds may be used in combination of two or more thereof. Examples of the solid epoxy compound include, but are not limited to, JER (registered trademark) 1002, JER (registered trademark) 1001, YX4000H, JER (registered trademark) 4004P, JER (registered trademark) 5050, JER (registered trademark) 154, JER (registered trademark) 157S70, JER 180S70 (trade names, manufactured by Mitsubishi Chemical Corporation), TEPIC (registered trademark) S, TEPIC (registered trademark) G, and TEPIC (registered trademark) P (trade names, manufactured by NISSAN CHEMICAL INDUSTRIES, LTD.), EPOTOTE (registered trademark) YH-434L (trade name, manufactured by Nippon Steel Chemical Co., Ltd.), EPPN 502H and NC3000 (trade names, manufactured by Nippon Kayaku Co., Ltd.), and EPICLON (registered trademark) N695, EPICLON (registered trademark) N865 and EPICLON (registered trademark) HP-7200 (trade names, manufactured by DIC CORPORATION). These solid epoxy compounds may be used in combination of two or more thereof.

The adhesive agent of the present invention contains an acid-modified rosin (c). The acid-modified rosin is obtained by subjecting raw material rosins such as a gum rosin, a wood rosin and a tall oil rosin, and unsaturated carboxylic acids such as (meth)acrylic acid, (anhydrous) maleic acid, fumaric acid, (anhydrous) citraconic acid and (anhydrous) itaconic acid to a diels-alder reaction (addition reaction). The raw material rosin is preferably refined by distillation, recrystallization or extraction for use in order to remove impurities such as metals and improve a resin color. The acid-modified rosin can be modified to an acid-modified rosin having a transparent color by hydrogenation. Examples of such acid-modified rosins include PINECRYSTAL (registered trademark) KE-604, PINECRYSTAL (registered trademark) KR-120, and MALKYD (registered trademark) No. 33 (trade names, produced by ARAKAWA CHEMICAL INDUSTRIES, LTD.).

These acid-modified rosins have two or more carboxyl groups. Therefore, the acid-modified rosin has excellent compatibility with the organic-solvent-soluble polyimide (a) and the epoxy compound (b). The acid-modified rosin can react with the epoxy compound to form a high-density network structure. It is thought that since the acid-modified rosin has a bulky cyclohexane ring produced by a bulky structure of the rosin itself and acid-modification, this sterically hinders the epoxy group from reacting with the carboxyl group to enhance stability in heating conditions of a heat-drying process of the adhesive agent and an assembly process. On the other hand, for example, at temperatures of 200° C. to 250° C. which are a hardening temperature of the adhesive agent, molecular mobility of the acid-modified rosin is enhanced and a reaction with the epoxy compound quickly proceeds to enable the completion of hardening of the adhesive agent in a short time.

The content of the acid-modified rosin (c) in the adhesive agent is preferably 5 parts by mass or more and 30 parts by mass or less with respect to 100 parts by mass of the epoxy compound (b). By setting the content of the acid-modified rosin to a value within the above range, it is possible to be excellent in storage life and to harden the adhesive agent in a short time. The content of the acid-modified rosin (c) is more preferably 20 parts by mass or less with respect to 100 parts by mass of the epoxy compound (b). Further, the content is more preferably 10 parts by mass or more.

Further, when the acid-modified rosin is used, there is also an effect of improving adhesiveness of the adhesive agent to metal materials such as an electrode and imparting a flux function to the adhesive agent. That is, by electrically connecting the circuit members by use of the adhesive agent of the present invention, it is possible to keep a joint clean, prevent resins or inorganic particles which are components of the adhesive agent from immixing between the circuit members of the joint, and enhance solder wettability. As described above, the acid-modified rosin (c) has an effect on both of an improvement of adhesiveness and an improvement of reliability of an electric connection. In addition to this, as described above, since an acidic group of the acid-modified rosin is consumed by the reaction with the epoxy compound during a hardening reaction and since the acid-modified rosin has a bulky structure, it is possible to prevent a metal portion such as an electrode from being corroded after bonding.

In addition to this, another publicly known latent hardener other than the acid-modified rosin may be used in conjunction with the acid-modified rosin. Particularly, a basic latent hardener exerts an interactive force with the acid-modified rosin, and therefore it can further enhance a latent property. As the basic latent hardener, imidazole-based latent hardeners can be preferably used. Specific examples of the imidazole-based latent hardeners to be preferably used include CUREZOL (registered trademark) 2PZCNS, CUREZOL (registered trademark) 2PZCNS-PW, CUREZOL (registered trademark) C11Z-CNS, CUREZOL (registered trademark) 2MZ-A, CUREZOL (registered trademark) C11-A, CUREZOL (registered trademark) 2E4MZ-A, CUREZOL (registered trademark) 2MZA-PW, CUREZOL (registered trademark) 2MAOK-PW, and CUREZOL (registered trademark) 2PHZ-PW (trade names, produced by SHIKOKU CHEMICALS CORPORATION); and NOVACURE (registered trademark) HX-3941HP, NOVACURE (registered trademark) HXA3922HP, NOVACURE (registered trademark) HXA3932HP, and NOVACURE (registered trademark) HXA3042HP (trade names, manufactured by ASAHI KASEI E-MATERIALS CORPORATION) that are microcapsule-type hardeners obtained by treating imidazole-based latent hardeners with isocyanates.

The adhesive agent of the present invention may further contain the inorganic particles (d). Examples of the material of the inorganic particles (d) include silica, alumina, titania, silicon nitride, boron nitride, aluminum nitride, iron oxide, glass, other metal oxides, metal nitrides, metal carbonates, and metal sulfates such as barium sulfate. These materials may be used singly or in combination of two or more of them. Among them, silica and alumina are preferably used from the viewpoint of low thermal expansibility, thermal dissipation performance, low moisture absorptivity, and dispersion stability in the adhesive agent.

The content of the inorganic particles (d) in the adhesive agent is preferably 30 to 80% by mass and more preferably 50 to 70% by mass with respect to the total amount of the aforementioned components (a) to (d). When the content of the inorganic particles (d) is 30 to 80% by mass, irregular thickness due to flow deformation hardly occurs during heat-drying the adhesive agent, and in association with this, connection reliability of a semiconductor device prepared by using this adhesive agent is more improved. It is more possible to maintain sufficient connection reliability particularly when the semiconductor device is subjected to a process where higher durability is required such as a moisture absorption-reflow process and a thermal cycle process. Further, dispersibility of inorganic particles in the adhesive agent is more sufficient, and the agglomeration of the inorganic particles less occurs. Further, when the adhesive agent is applied onto a release plastic film to form an adhesive film and the adhesive film is wound into a roll shape, problems that cracks are produced in the adhesive sheet or the adhesive sheet is separated from the release plastic film hardly occur.

The inorganic particles (d) may have either a spherical form or a nonspherical form such as a crushed form or a flake form; however, they preferably have a spherical form from the viewpoint of easy uniform dispersibility in the adhesive agent. Further, the average particle size of the spherical inorganic particles is preferably 3 μm or less. The average particle size is more preferably 10 nm or more and 1 μm or less. When the average particle size is 10 nm or more, dispersibility of the inorganic particles is more improved, which allows the inorganic particles to be contained in the adhesive agent in a higher concentration. When the average particle size is 3 μm or less, since a surface area of the inorganic particles is adequately large, an interactive force of the inorganic particles (d) with the above components (a) to (c) and a component mixed as required is adequately large, and the adhesive agent is more hardly fluidized and deformed during heat-drying.

When the adhesive agent needs to have transparency, the particle size of the inorganic particles is preferably 100 nm or less, more preferably 60 nm or less. For example, the adhesive agent needs to have transparency when, after a film of the adhesive agent is formed on a substrate, it is necessary to visually identify marks on the surface of the substrate through the adhesive agent for the purpose of alignment and the like.

It is to be noted that the average particle size of the inorganic particles refers to the most frequently observed size of the individual inorganic particles. When the inorganic particles have a spherical form, the particle size of the inorganic particles refers to its diameter, and when the inorganic particles have an oval or flat form, the particle size refers to its maximum length in such a shape. Further, when the inorganic particles have a rod or fibrous form, the particle size refers to its maximum longitudinal length. As a method for measuring the average particle size of the inorganic particles contained in the adhesive agent, a SEM (scanning electron microscope) is used for directly observing the particles and measuring particle sizes of 100 particles. The maximum likelihood particle size on the number basis is selected from a distribution of the particle sizes obtained by measurement and defined as an average particle size.

For the purpose of reducing the stress of a film obtained by hardening the adhesive agent, the adhesive agent of the present invention may further contain a thermoplastic resin. Examples of the thermoplastic resin include, but not limited to, phenoxy resins, polyesters, polyurethanes, polyamides, polypropylene, acrylonitrile-butadiene copolymer (NBR), styrene-butadiene copolymer, (SBR), acrylonitrile-butadiene-methacrylic acid copolymer, and acrylonitrile-butadiene-acrylic acid copolymer. Moreover, the adhesive agent of the present invention may contain an ion scavenger, a surfactant, a silane coupling agent, an organic dye or an inorganic pigment.

The adhesive agent of the present invention may be used as a varnish obtained by mixing its constituents materials in a solvent. The adhesive agent of the present invention may be used as an adhesive agent film obtained by forming the adhesive agent into a sheet-shape. Examples of the method of forming the adhesive agent into a sheet shape include a method of applying the adhesive agent varnish onto a release base material and then removing a solvent.

Examples of the solvent include, but not limited to: ketone-based solvents such as acetone, methyl ethyl ketone, methyl isobutyl ketone, cyclopentanone, and cyclohexanone; ether-based solvents such as 1,4-dioxane, tetrahydrofurane, and diglyme; glycol ether-based solvents such as methyl cellosolve, ethyl cellosolve, propylene glycol monomethyl ether, propylene glycol monoethyl ether, propylene glycol monobutyl ether, and diethylene glycol methyl ethyl ether; and other solvents such as benzyl alcohol, N-methylpyrrolidone, γ-butyrolactone, ethyl acetate, and N,N-dimethylformamide. These solvents may be used singly or in combination of two or more thereof.

Examples of the release base material include, but not limited to, polypropylene film, polyethylene terephthalate film, polyethylene naphthalate film, polyester film, polyvinyl chloride film, polycarbonate film, polyimide film, fluoropolymer film such as polytetrafluoroethylene film, polyphenylene sulfide film, polypropylene film, and polyethylene film. The release base material may be subjected to release treatment using a releasing agent such as a silicone-based releasing agent, a long-chain alkyl-based releasing agent, a fluorine-based releasing agent, or an aliphatic amide-based releasing agent. The thickness of the release base material is not particularly limited; however, the thickness is usually preferably 5 to 75 μm. The thickness of the release base material is preferably equal to or larger than that of the adhesive agent from the viewpoint of reducing residual stress in the adhesive agent. Further, another release base material is preferably laminated on the surface of the adhesive agent opposite to the surface having the release base material of the adhesive agent film, that is, the adhesive agent film is preferably sandwiched between two release base materials. As the another release base material, one made of the above-mentioned material and having a thickness within the above-mentioned range may be used. The two release base materials may be the same.

When the release base material is laminated on both sides of the adhesive agent film, it is preferred that there is a difference between the adhesive force between one of the release base materials and the adhesive agent film and the adhesive force between the other release base material and the adhesive agent film. Particularly, the difference in adhesive force is preferably 5 N/m or more, more preferably 47 N/m or less. By setting the difference in adhesive force to 5 N/m or more, it is possible, when one of the release base materials whose adhesive force to the adhesive agent film is smaller is peeled off, to prevent the adhesive agent film from being totally or partially separated from the other release base material. Further, by setting the difference in adhesive force to 47 N/m or less, the adhesive agent is less likely to remain on the surface of each of the release base materials when the release base material is peeled off.

The varnish-like adhesive agent obtained by mixing its constituent materials in a solvent may be used for a semiconductor wafer or a circuit board by applying it onto a release base material and removing the solvent.

The minimum melt viscosity of the adhesive agent of the present invention is preferably 100 Pa·s or more and 10,000 Pa·s or less. The minimum melt viscosity is more preferably 600 Pa·s or more and 5,000 Pa·s or less. By setting the minimum melt viscosity to a value within the above range, in the case of using the adhesive agent as an adhesive agent film, it is possible to laminate the adhesive agent film on a semiconductor wafer or a circuit board without causing the film to be wrinkled or trapping air bubbles between the film and the semiconductor wafer or the circuit board. In addition, it is also possible to reduce the amount of the adhesive agent squeezing out from the edges of a semiconductor chip during semiconductor chip bonding. It is to be noted that the minimum melt viscosity of the adhesive agent can be measured using, for example, a dynamic viscoelasticity measurement apparatus and a sample having a diameter of 15 mm and a thickness of 0.8 mm at a temperature rise rate of 2° C./min, a measuring frequency of 1 Hz and a measuring distortion of 9% within a measurement temperature range of 0 to 150° C. The viscosity of the adhesive agent decreases as the measurement temperature increases from 0° C., but it turns to an increase due to a hardening reaction when the temperature exceeds a certain value. A minimal value of the viscosity at this time is taken as a minimum melt viscosity.

The adhesive agent of the present invention preferably has a minimum melt viscosity of 100 to 10000 Pa·s after stored for one month under the circumstance of 23° C. and 55% in relative humidity (RH). Thereby, even when the adhesive agent film made of the adhesive agent of the present invention is laminated on a semiconductor wafer or a circuit board after storage for an extended period of time, it is possible to laminate the adhesive agent film without causing the film to be wrinkled or trapping air bubbles between the film and the semiconductor wafer or the circuit board. In addition, it is also possible to reduce the amount of the adhesive agent squeezing out from the edges of a semiconductor chip during semiconductor chip bonding.

In the present invention, the acid-modified rosin is used as a hardening agent for an adhesive agent. The acid-modified rosin has a bulky cyclohexane ring produced by acid-modification in addition the fact that the rosin itself has a bulky structure, and therefore this sterically hinders the epoxy group from reacting with the carboxyl group to enable controlling the minimum melt viscosity after storing under the aforementioned conditions so as to be in a range of 100 to 10000 Pa·s.

The adhesive agent of the present invention can be suitably used as an adhesive agent for a semiconductor for use in bonding or fixing between circuit members such as a semiconductor element, a circuit board and a metal wiring material which are used for a semiconductor device, or in sealing of a semiconductor element.

A semiconductor device of the present invention includes a hardened article of the adhesive agent or a hardened article of the adhesive agent film. The semiconductor device referred to herein refers to overall devices capable of functioning by use of characteristics of a semiconductor element. The semiconductor device includes all of one obtained by connecting a semiconductor element to a substrate or one obtained by connecting the semiconductor elements to each other or substrates to each other, electrooptic devices, semiconductor circuit boards, and electronic parts.

A method for producing a semiconductor device of the present invention is characterized in that the adhesive agent or the adhesive agent film is interposed between a first circuit member and a second circuit member; and the first circuit member and the second circuit member are electrically connected to each other through application of heat and pressure.

Hereinafter, a method for producing a semiconductor device using the adhesive agent of the present invention will be described with reference to one example. First, a first circuit member having a first connection terminal and a second circuit member having a second connection terminal are prepared. Herein, examples of the circuit member include chip components such as a semiconductor chip, a resistor chip and a capacitor chip; and substrates such as a semiconductor chip or a silicon interposer having TSV (through-silicon via) electrodes, a glass epoxy circuit board, a film circuit board, a glass substrate and a glass interposer with a through electrode. Examples of the connection terminals include plated bumps made of gold or copper, a copper pillar bump with a solder cap in which a semispherical solder is formed at a tip of a copper pillar, bump electrodes such as stud bumps, solder balls, and pad electrodes. A through-electrode may be formed in one or both of the first circuit member and the second circuit member, and a connection terminal may be formed on one or both of the surfaces of the member.

The first circuit member and the second circuit member are placed so that the first connection terminal and the second connection terminal are opposed to each other. Then, the adhesive agent of the present invention is interposed between the first connection terminal and the second connection terminal opposed to each other. The first and second connection terminals opposed to each other are electrically connected to each other through the application of heat and pressure to the first and second circuit members. By this process step, the first circuit member and the second circuit member are securely electrically connected to each other, and the adhesive agent is hardened to physically fix the first circuit member and the second circuit member to each other.

Herein, the adhesive agent may be provided for only the connection terminal-side surface of any of the circuit members in advance or may be provided for both the connection terminal-side surface of the first circuit member and the connection terminal-side surface of the second circuit member.

As an example of a more detail embodiment, a method for producing a semiconductor device will be described in which a semiconductor chip having a first circuit member and bumps are connected to a circuit board or a semiconductor chip having a wiring pattern as a second circuit member with the adhesive agent film of the present invention interposed therebetween so that the gap between the first circuit member and the second circuit member is sealed with the adhesive agent.

First, the adhesive agent film is attached to the circuit board or the semiconductor chip having a wiring pattern formed as a second circuit member. At this time, the adhesive agent film may be cut to have a predetermined size and then attached to the wiring pattern surface of the circuit board having a wiring pattern or the bump-forming surface of the semiconductor chip. Alternatively, the adhesive agent film may be attached to the bump-forming surface of a semiconductor wafer and then the semiconductor wafer may be singulated by dicing the semiconductor wafer to prepare semiconductor chips having the adhesive agent film attached thereto.

Next, the semiconductor chip as the first circuit member is placed so that the bumps of the first circuit member and the wiring patterns of the second circuit member are opposed to each other, and heat and pressure are applied to both of the bumps and the wiring patterns using a bonding apparatus. Conditions of application of heat and pressure are not particularly limited as long as good electrical connection can be achieved, but application of heat and pressure needs to be performed at a temperature of 100° C. or higher and a pressure of 1 mN/bump or larger for 0.1 second or longer in order to harden the adhesive agent. The bonding temperature is preferably 120° C. or higher and 300° C. or lower, more preferably 150° C. or higher and 250° C. or lower, the bonding pressure is preferably 5 mN/bump or larger and 50,000 mN/bump or less, more preferably 10 mN/bump or larger and 10,000 mN/bump or less, and the bonding time is preferably 1 second or longer and 60 seconds or shorter, more preferably 2 seconds or longer and 30 seconds or shorter. During bonding, the bumps on the semiconductor chip and the wiring pattern on the circuit board may be brought into contact with each other and temporarily pressure-bonded together by applying heat and pressure for 0.1 second or longer at a temperature of 50° C. or higher and a pressure of 1 mN/bump or larger, and then finally bonded together under the above-mentioned conditions. If necessary, after the completion of bonding, the circuit board with the semiconductor chip may be heated at a temperature of 50° C. or higher and 200° C. or lower for 10 seconds or longer and 24 hours or shorter.

The adhesive agent of the present invention can also be used as an adhesive resin material for producing a die attach film, a dicing die attach film, a lead frame fixing tape, adhesive agents of radiator plates, reinforcing plates, and shielding materials, solder resist and the like.

Due to recent significant progress of automation of processes for producing a semiconductor device, adhesive agents for semiconductor and circuit boards or semiconductor chips having an adhesive agent for semiconductor applied thereonto are required to be able to be stored at room temperature for preferably 30 days or longer, more preferably 60 days or longer before hardening. The use of the adhesive agent of the present invention makes it possible to obtain a semiconductor device that can be stored for 60 days or longer even at room temperature, causes no foaming during bonding, provides initial electrical continuity even by a brief application of heat and pressure, and has excellent connection reliability such that electrical continuity can be maintained even after a heat shock test performed between −40° C. to 125° C. after moisture absorption-reflow.

EXAMPLES

Hereinafter, the present invention will be described with reference to the following examples, but is not limited to these examples.

Synthesis Example 1

Synthesis of Polyimide A

Under a dry nitrogen flow, 4.82 g (0.0165 mol) of 1,3-bis(3-aminophenoxy)benzene (hereinafter, referred to as "APB-N"), 3.08 g (0.011 mol) of 3,3'-diamino-4,4'-dihydroxydiphenylsulfone (hereinafter, referred to as "ABPS"), 4.97 g (0.02 mol) of 1,3-bis(3-aminopropyl)tetramethyldisiloxane) (hereinafter, referred to as "SiDA"), and 0.55 g (0.005 mol) of 3-aminophenol as a terminal blocking agent were dissolved in 130 g of N-methylpyrrolidone (hereinafter, referred to as "NMP"). To this, 26.02 g (0.05 mol) of 2,2-bis{4-(3,4-dicarboxyphenoxy)phenyl}propane dianhydride (hereinafter, referred to as "BSAA") was added together with 20 g of NMP, and the resulting mixture was reacted at 25° C. for 1 hour and then stirred at 50° C. for 4 hours. Thereafter, the mixture was stirred at 180° C. for 5 hours. After the completion of stirring, the resulting solution was charged into 3 L of water and filtered, and a precipitate was collected, washed with water three times and dried at 80° C. for 20 hours using a vacuum drier. The infrared absorption spectrum of the resulting polymer solid was measured, and consequently, absorption peaks of an imide structure derived from a polyimide were detected at about 1780 cm$^{-1}$ and 1377 cm$^{-1}$. In this manner, a polyimide A having a phenolic hydroxyl group at its terminal and in its side chain and containing 11.5% by mass of a structure represented by the general formula (1) was obtained. When 6 g of tetrahydrofuran was added to 4 g of the polyimide A and stirred at 23° C., the polyimide A was dissolved.

Synthesis Example 2

Synthesis of Polyimide B

Under a dry nitrogen flow, 4.82 g (0.0165 mol) of APB-N, 3.08 g (0.011 mol) of ABPS, 4.97 g (0.02 mol) of SiDA, and 0.47 g (0.005 mol) of aniline as a terminal blocking agent were dissolved in 130 g of NMP. To this, 26.02 g (0.05 mol) of BSAA was added together with 20 g of NMP, and the resulting mixture was reacted at 25° C. for 1 hour and then stirred at 50° C. for 4 hours. Thereafter, the mixture was stirred at 180° C. for 5 hours. After the completion of stirring, the resulting solution was charged into 3 L of water and filtered, and a precipitate was collected, washed with water three times and dried at 80° C. for 20 hours using a vacuum drier. The infrared absorption spectrum of the resulting polymer solid was measured, and consequently, absorption peaks of an imide structure derived from a polyimide were detected at about 1780 cm$^{-1}$ and 1377 cm$^{-1}$. In this manner, a polyimide B having a phenolic hydroxyl group in its side chain and containing 11.6% by mass of a structure represented by the general formula (1) was obtained. When 6 g of tetrahydrofuran was added to 4 g of the polyimide B and stirred at 23° C., the polyimide B was dissolved.

Synthesis Example 3

Synthesis of Polyimide C

Under a dry nitrogen flow, 24.54 g (0.067 mol) of 2,2-bis(3-amino-4-hydroxyphenyl)hexafluoropropane (hereinafter, referred to as "BAHF"), 4.97 g (0.02 mol) of SiDA, and 1.86 g (0.02 mol) of aniline as a terminal blocking agent were dissolved in 80 g of NMP. To this, 31.02 g (0.1 mol) of bis(3,4-dicarboxyphenyl)ether dianhydride (hereinafter, referred to as "ODPA") was added together with 20 g of NMP, and the resulting mixture was reacted at 20° C. for 1 hour and then stirred at 50° C. for 4 hours. Thereafter, 15 g of xylene was added, and the resulting mixture was stirred at 180° C. for 5 hours while boiling water together with xylene. After the completion of stirring, the resulting solution was charged into 3 L of water to obtain a white precipitate of a polymer. The precipitate was collected through filtration, washed with water three times and dried at 80° C. for 20 hours using a vacuum drier. The infrared absorption spectrum of the resulting polymer solid was measured, and consequently, absorption peaks of an imide structure derived from a polyimide were detected at about 1780 cm$^{-1}$ and 1377 cm$^{-1}$. In this manner, a polyimide C having a phenolic hydroxyl group in its side chain and containing 7.5% by mass of a structure represented by the general formula (1) was obtained. When 6 g of tetrahydrofuran was added to 4 g of the polyimide C and stirred at 23° C., the polyimide C was dissolved.

Synthesis Example 4

Synthesis of Polyimide D

Under a dry nitrogen flow, 8.03 g (0.0275 mol) of APB-N, 4.97 g (0.02 mol) of SiDA, and 0.47 g (0.005 mol) of aniline as a terminal blocking agent were dissolved in 130 g of NMP. To this, 26.02 g (0.05 mol) of BSAA was added together with 20 g of NMP, and the resulting mixture was reacted at 25° C. for 1 hour and then stirred at 50° C. for 4 hours. Thereafter, the mixture was stirred at 180° C. for 5 hours. After the completion of stirring, the resulting solution was charged into 3 L of water and filtered, and a precipitate was collected, washed with water three times and dried at 80° C. for 20 hours using a vacuum drier. The infrared absorption spectrum of the resulting polymer solid was measured, and consequently, absorption peaks of an imide structure derived from a polyimide were detected at about 1780 cm$^{-1}$ and 1377 cm$^{-1}$. In this manner, a polyimide D containing 11.6% by mass of a structure represented by the general formula (1) was obtained. When 6 g of tetrahydrofuran was added to 4 g of the polyimide D and stirred at 23° C., the polyimide D was dissolved.

Other materials used in Examples and Comparative Examples are as follows.

(b) Epoxy Compound

Solid Epoxy Compound

N865 (trade name, epoxy equivalent: 200 g/eq, produced by DIC CORPORATION)

Liquid Epoxy Compound

YL980 (trade name, epoxy equivalent: 185 g/eq, produced by Mitsubishi Chemical Corporation)

(c) Acid-Modified Rosin

KE-604 (trade name, acid number 240 (KOHmg/g), softening point 130° C., color 150 Hazen, acryl-modified rosin, produced by ARAKAWA CHEMICAL INDUSTRIES, LTD.)

KR-120 (trade name, acid number 320 (KOHmg/g), softening point 120° C., color 150 Hazen, produced by ARAKAWA CHEMICAL INDUSTRIES, LTD.)

(c') Other Latent Hardener

Liquid epoxy compound contained in NOVACURE (registered trademark) HXA-3941HP (trade name, produced by ASAHI KASEI E-MATERIALS CORPORATION). NOVACURE (registered trademark) HXA-3941HP contains a microcapsule-type hardener and a liquid epoxy compound at a ratio of 1:2, and the liquid epoxy compound contained in NOVACURE (registered trademark) HXA-3941HP is a 1:4 mixture of a bisphenol A-type epoxy compound and a bisphenol F-type epoxy compound. In rows labeled "HXA-3941HP" in Tables, values in parentheses represent the amount (parts by mass) of microcapsules.

(d) Inorganic Particle

SO-E2 (trade name, manufactured by Admatechs Co., Ltd., spherical silica particles, average particle size: 0.5 μm)

(f) Solvent: methyl isobutyl ketone (hereinafter, referred to as MIBK)

(g) Rosin

KR-85 (trade name, acid number 175 (KOHmg/g), softening point 85° C., color 60 Hazen, produced by ARAKAWA CHEMICAL INDUSTRIES, LTD.)

Examples 1 to 30 and Comparative Examples 1 to 8

(1) Method for Preparing Adhesive Agent Film

Adhesive agent varnishs were prepared by mixing the components (a) to (f) shown in Tables 1 to 4 in compounding ratios shown in Tables 1 to 4. Each of the adhesive agent varnishes thus prepared was applied onto the treated surface of a 50 μm-thick polyester terephthalate film (trade name, Cerapeel (registered trademark) HP2(U) as a release base material by using a slit die coater (coating machine), and was then dried at 80° C. for 10 minutes to obtain an adhesive agent film. Onto the obtained adhesive agent film having a dried thickness of 50 μm, an untreated surface of a 10 μm-thick polypropylene film (trade name, TORAYFAN (registered trademark) BO YK57, one-side corona discharge treated film) was laminated as another release base material, and the adhesive agent film was wound around a paper core having an outer diameter of 9.6 cm into a roll shape in such a manner that the release base material HP2(U) was located outside to obtain a master roll of a sheet in which the adhesive agent film has the release base materials on both surfaces thereof. Then, the master roll of the sheet was slit into a width of 7.5 mm by using a film slitter and wound around reels having an outer diameter of 5.0 cm into a roll shape in such a manner that the release base material HP2(U) was located outside to obtain a tape roll of the adhesive agent film whose both surfaces were covered with the release base materials. The obtained tape roll was divided into two groups depending on their storage conditions and evaluated. One was subjected to the following processes (2) to (5) just after preparation and the other was stored for one month or three months under the circumstance of 23° C. and 55% in RH and then was subjected to the following processes (2) to (5).

(2) Tape Attachment Process

Using a tape bonding machine (DA 2000 manufactured by Toray Engineering Co., Ltd.), the adhesive agent film was bonded to the circuit board. First, the release base material YK57 was removed from the tape roll of the adhesive agent film whose both surfaces were covered with the release base materials prepared in the above (1) to expose the surface of the adhesive agent film. Then, the surface of the adhesive agent film, from which the release base material YK57 had been removed, was bonded at 80° C. for 1 second to a circuit board (solid copper pad electrodes, a glass epoxy substrate with a circuit on which 300 semiconductor chips of 7.5 mm square can be mounted) fixed on a stage, and then the release base material HP2 (U) was removed. This tape attachment process was repeatedly performed to obtain a circuit board having 300 areas to which the adhesive agent film of 7.5 mm square was bonded.

(3) Flip Chip Bonding and Display Test of Prepared Liquid Crystal Panels

The circuit board with the adhesive agent prepared in the above (2) was dried at 80° C. for 1 hour. Next, semiconductor chips were flip-chip bonded to the circuit board with the adhesive agent using a flip chip bonding machine (model FC-2000 manufactured by Toray Engineering Co., Ltd.). Semiconductor chip (with bump electrodes made of copper of 30 μm and lead-free solder of 15 μm, 448 bumps/chip, pitch: 60 μm, peripheral arrangement, 7.5 mm-square chip) was fixed to a bonding stage heated to 80° C., and the semiconductor chip was temporarily pressure-bonded to the circuit board with the adhesive agent under conditions of a temperature of 80° C., a pressure of 15 N/chip, and a time of 5 seconds, and then the semiconductor chip was finally pressure-bonded under conditions of a temperature of 250° C., a pressure of 200 N/chip, and a time of 10 seconds. The bonding was performed per chip and repeated until 300 semiconductor chips were bonded to all the 300 areas. It is to be noted that the time from the beginning to end of bonding was 60 minutes. After the completion of bonding, the circuit board was divided by a substrate cutting machine into 300 circuit boards with a semiconductor. It is noted that in the obtained circuit boards with a semiconductor, a daisy chain was configured by connection between the semiconductor chip and the circuit board. Each of the prepared circuit boards with a semiconductor was incorporated into a liquid crystal substrate to prepare a liquid crystal panel (semiconductor device), and the liquid crystal panel was subjected to a display test. When displaying images, the liquid crystal panel was evaluated as "acceptable", and when displaying no images due to defective connection between the chip and the circuit board, the liquid crystal panel was evaluated as "unacceptable". The display test was performed on all the 300 liquid crystal panels, and the case where a ratio of acceptable liquid crystal panels was 99.5% or more was rated as "A", the case of being 95.0% or more and less than 99.5% was rated as "B", and the case of being less than 95.0% was rated as "C". These results are shown in Tables 1 to 4 (Before Reliability Test).

(4) Display Test of Liquid Crystal Panels after Connection Reliability Test

Twenty circuit boards with a semiconductor were selected from the circuit boards with a semiconductor evaluated as "acceptable" in the display test in the above (3), and were then left standing in a constant temperature and humidity chamber under conditions of 85° C. and 60% in RH for 168 hours for moisture absorption. Thereafter, solder reflow was performed under reflow conditions of 260° C. and 5 seconds (moisture absorption-reflow process). Subsequently, 10 of the 20 samples (circuit boards with a semiconductor) were subjected to 1000 cycles each consisting of storage at −40° C. for 5 minutes and storage at 125° C. for 5 minutes, and the remaining 10 samples (circuit boards with a semiconductor) were subjected to 2000 cycles. After these treatment, each of the circuit boards with a semiconductor was incorporated into a liquid crystal substrate to prepare a liquid crystal panel, and all liquid crystal panels using the circuit boards with a semiconductor subjected to 1000 or 2000 cycles were subjected to a display test. The case where all the 10 liquid crystal panels using the circuit boards after 1000 cycles or 2000 cycles displayed images was rated as "A", and the case where not all the 10 liquid crystal panels displayed images due to the occurrence of defective connection was rated as "C". The evaluation results are shown in Tables 1 to 4 (After Reliability Test/1000 cycles, 2000 cycles).

(5) Melt Viscosity Measurement of Adhesive Agent after Left Standing for 1 Month and 3 Months Under Circumstance of 23° C. and 55% in RH The melt viscosity of each of the adhesive agent films, which had been stored for one month or three months under the circumstance of 23° C. and 55% in RH in the above (1), was measured in the following conditions. The case where the minimum melt viscosity was 100 Pa·s or more and 10000 Pa·s or less was rated as "A", and the other cases were rated as "C".

Dynamic viscoelasticity measurement apparatus: MCR-302 (manufactured by Anton Paar Japan K.K.)

Sample dimension: diameter 15 mm, thickness 0.8 mm

Temperature rise rate: 2° C./rain

Measuring frequency: 1 Hz

Measuring distortion: 9%

Measuring temperature range: 0 to 150° C.

TABLE 1

| | | | | | | | Example | | | | | | Comparative Example | |
|---|---|---|---|---|---|---|---|---|---|---|---|---|---|---|
| | | | | | | 1 | 2 | 3 | 4 | 5 | 6 | 7 | 1 | 2 |
| Composition of Adhesive Agent (part(s) by weight) | (a) | Polyimide | having functional group in side chain | Polyimide B | | | | | | | | | | |
| | | | having functional group at terminal and in side chain | Polyimide A | | 25 | 25 | 25 | 25 | 25 | 25 | 25 | 25 | 25 |
| | (b) | Epoxy Compound | Solid Epoxy Compound | N865 | | 30 | 30 | 30 | 30 | 30 | 30 | 30 | 30 | 30 |
| | | | Liquid Epoxy Compound | YL980 | | 30 | 30 | 30 | 30 | 30 | 30 | 30 | 30 | 30 |
| | | | Total | | | 60 | 60 | 60 | 60 | 60 | 60 | 60 | 60 | 60 |
| | (c) or (c') | Latent Hardener | Acid-Modified Rosin | KE-604 | | 2 | 4 | 6 | 10 | 12 | 18 | 20 | | |
| | (e) | Hardening Agent | Rosin | KR-85 | | | | | | | | | | 10 |
| | (f) | Solvent | MIBK | | | 50 | 50 | 50 | 50 | 50 | 50 | 50 | 50 | 50 |
| | | Parts by Weight of Acid-Modified Rosin (with respect to 100 parts by weight of epoxy compound) | | | | 3 | 7 | 10 | 17 | 20 | 30 | 33 | 0 | 0 |
| Display Test of Liquid Crystal Panel | | Immediately after Adhesive Agent Preparation | | Before Reliability Test | | B | A | A | A | A | B | B | B | B |
| | | | | After Reliability Test (1000 cycle) | | C | C | C | C | C | C | C | C | C |
| | | | | After Reliability Test (2000 cycle) | | C | C | C | C | C | C | C | C | C |
| | | Adhesive Agent under Circumstance of 23° C. and 55% in RH After Lapse of 1 Month | | Before Reliability Test | | B | B | B | B | B | B | B | C | C |
| | | | | After Reliability Test (1000 cycle) | | C | C | C | C | C | C | C | C | C |
| | | | | After Reliability Test (2000 cycle) | | C | C | C | C | C | C | C | C | C |
| | | Adhesive Agent under Circumstance of 23° C. and 55% in RH After Lapse of 3 Months | | Before Reliability Test | | C | C | C | C | C | C | C | C | C |
| | | | | After Reliability Test (1000 cycle) | | C | C | C | C | C | C | C | C | C |
| | | | | After Reliability Test (2000 cycle) | | C | C | C | C | C | C | C | C | C |
| Melt Viscosity Evaluation | | Adhesive Agent under Circumstance of 23° C. and 55% in RH After Lapse of 1 Month | | | | A | A | A | A | A | A | A | C | C |
| | | Adhesive Agent under Circumstance of 23° C. and 55% in RH After Lapse of 3 Months | | | | C | C | C | C | C | C | C | C | C |

TABLE 2

| | | | | | | | Example | | | | | | Comparative Example | |
|---|---|---|---|---|---|---|---|---|---|---|---|---|---|---|
| | | | | | | 8 | 9 | 10 | 11 | 12 | 13 | 14 | 3 | 4 |
| Composition of Adhesive Agent (part(s) by weight) | (a) | Polyimide | having functional group in side chain | Polyimide B | | 25 | 25 | 25 | 25 | 25 | 25 | 25 | 25 | 25 |
| | | | having functional group at terminal and in side chain | Polyimide A | | | | | | | | | | |
| | (b) | Epoxy Compound | Solid Epoxy Compound | N865 | | 30 | 30 | 30 | 30 | 30 | 30 | 30 | 30 | 30 |
| | | | Liquid Epoxy Compound | YL980 | | 30 | 30 | 30 | 30 | 30 | 30 | 30 | 30 | 30 |
| | | | Total | | | 60 | 60 | 60 | 60 | 60 | 60 | 60 | 60 | 60 |
| | (c) or (c') | Latent Hardener | Acid-Modified Rosin | KE-604 | | 2 | 4 | 6 | 10 | 12 | 18 | 20 | | |
| | (e) | Hardening Agent | Rosin | KR-85 | | | | | | | | | | 10 |
| | (f) | Solvent | MIBK | | | 50 | 50 | 50 | 50 | 50 | 50 | 50 | 50 | 50 |
| | | Parts by Weight of Acid-Modified Rosin (with respect to 100 parts by weight of epoxy compound) | | | | 3 | 7 | 10 | 17 | 20 | 30 | 33 | 0 | 0 |
| Display Test of Liquid Crystal Panel | | Immediately after Adhesive Agent Preparation | | Before Reliability Test | | B | A | A | A | A | B | B | B | B |
| | | | | After Reliability Test (1000 cycle) | | C | C | C | C | C | C | C | C | C |
| | | | | After Reliability Test (2000 cycle) | | C | C | C | C | C | C | C | C | C |

TABLE 2-continued

|  |  |  | Example | | | | | | | Comparative Example | |
|---|---|---|---|---|---|---|---|---|---|---|---|
|  |  |  | 8 | 9 | 10 | 11 | 12 | 13 | 14 | 3 | 4 |
|  | Adhesive Agent under Circumstance of 23° C. and 55% in RH After Lapse of 1 Month | Before Reliability Test | B | B | B | B | B | B | B | C | C |
|  |  | After Reliability Test (1000 cycle) | C | C | C | C | C | C | C | C | C |
|  |  | After Reliability Test (2000 cycle) | C | C | C | C | C | C | C | C | C |
|  | Adhesive Agent under Circumstance of 23° C. and 55% in RH After Lapse of 3 Months | Before Reliability Test | B | B | B | B | B | B | B | C | C |
|  |  | After Reliability Test (1000 cycle) | C | C | C | C | C | C | C | C | C |
|  |  | After Reliability Test (2000 cycle) | C | C | C | C | C | C | C | C | C |
| Melt Viscosity Evaluation | Adhesive Agent under Circumstance of 23° C. and 55% in RH After Lapse of 1 Month | | A | A | A | A | A | A | A | C | C |
|  | Adhesive Agent under Circumstance of 23° C. and 55% in RH After Lapse of 3 Months | | A | A | A | A | A | A | A | C | C |

TABLE 3

| | | | | Example | | | | | | | Comparative Example | |
|---|---|---|---|---|---|---|---|---|---|---|---|---|
| | | | | 15 | 16 | 17 | 18 | 19 | 20 | 21 | 5 | 6 |
| Composition of Adhesive Agent (part(s) by weight) | (a) | Polyimide | having functional group in side chain | Polyimide B | 25 | 25 | 25 | 25 | 25 | 25 | 25 | 25 | 25 |
| | | | having functional group at terminal and in side chain | Polyimide A | | | | | | | | | |
| | (b) | Epoxy Compound | Solid Epoxy Compound | N865 | 30 | 30 | 30 | 30 | 30 | 30 | 30 | 30 | 30 |
| | | | Liquid Epoxy Compound | YL980 | 5 | 5 | 5 | 5 | 5 | 5 | 5 | 5 | 5 |
| | | | | Parts by Weight Contained in (c) | 26.7 | 26.7 | 26.7 | 26.7 | 26.7 | 26.7 | 26.7 | 26.7 | 26.7 |
| | | | | Total | 61.7 | 61.7 | 61.7 | 61.7 | 61.7 | 61.7 | 61.7 | 61.7 | 61.7 |
| | (c) or (c') | Latent Hardener | Acid-Modified Rosin | KE-604 | 2 | 4 | 6 | 10 | 12 | 18 | 22 | 50 | 50 |
| | | | Basic Latent Hardener (in parentheses, part(s) by weight of a latent hardener) | HXA-3941HP | 40 (13.3) | 40 (13.3) | 40 (13.3) | 40 (13.3) | 40 (13.3) | 40 (13.3) | 40 (13.3) | 40 (13.3) | 40 (13.3) |
| | (d) | Inorganic particle | Spherical Silica | SO-E2 | 155 | 155 | 155 | 155 | 155 | 155 | 155 | 155 | 155 |
| | (e) | Hardening Agent | Rosin | KR-85 | 3 | 6 | 10 | 16 | 19 | 29 | 36 | 0 | 10 |
| | (f) | Solvent | | MIBK | 60 | 60 | 59 | 58 | 58 | 57 | 56 | 61 | 58 |
| Parts by Weight of Acid-Modified Rosin (with respect to 100 parts by weight of epoxy compound) | | | | | 50 | 50 | 50 | 50 | 50 | 50 | 50 | 50 | 50 |
| Content of Inorganic Particles (% by mass) | | | | | B | A | A | A | A | B | B | B | B |
| Immediately after Adhesive Agent Preparation | | | | | A | A | A | A | A | A | A | A | A |
| Display Test of Liquid Crystal Panel | Before Reliability Test | | | | C | A | A | A | A | A | B | C | C |
| | After Reliability Test (1000 cycle) | | | | B | A | A | A | A | B | B | C | C |
| | After Reliability Test (2000 cycle) | | | | C | C | C | C | C | C | C | C | C |
| | Adhesive Agent under Circumstance of 23° C. and 55% in RH After Lapse of 1 Month | Before Reliability Test | | | B | B | B | B | A | B | B | C | C |
| | | After Reliability Test (1000 cycle) | | | C | A | A | A | A | A | C | C | C |
| | | After Reliability Test (2000 cycle) | | | C | C | C | C | C | C | C | C | C |
| | Adhesive Agent under Circumstance of 23° C. and 55% in RH After Lapse of 3 Months | Before Reliability Test | | | B | B | B | B | A | B | B | C | C |
| | | After Reliability Test (1000 cycle) | | | C | A | A | A | A | A | C | C | C |
| | | After Reliability Test (2000 cycle) | | | C | C | C | C | C | C | C | C | C |
| Melt Viscosity Evaluation | Adhesive Agent under Circumstance of 23° C. and 55% in RH After Lapse of 1 Month | | | | A | A | A | A | A | A | A | C | C |
| | Adhesive Agent under Circumstance of 23° C. and 55% in RH After Lapse of 3 Months | | | | A | A | A | A | A | A | A | C | C |

TABLE 4

| Composition of Adhesive Agent (part(s) by weight) | | | | | Example 22 | 23 | 24 | 25 | 26 | 27 | 28 | 29 | 30 | Comparative Example 7 | 8 |
|---|---|---|---|---|---|---|---|---|---|---|---|---|---|---|---|
| (a) | Polyimide | having functional group in side chain | Polyimide B | | 25 | 25 | 25 | 25 | 25 | 25 | 25 | 25 | 25 | 25 | 25 |
| | | having functional group at terminal and in side chain | Polyimide A | | | | | | | | | | | | |
| (b) | Epoxy Compound | Solid Epoxy Compound | N865 | | 30 | 30 | 30 | 30 | 30 | 30 | 30 | 30 | 30 | 30 | 30 |
| | | Liquid Epoxy Compound | YL980 | | 5 | 5 | 5 | 5 | 5 | 5 | 5 | 5 | 5 | 5 | 5 |
| | | | Parts by Weight Contained in (c) | | 26.7 | 26.7 | 26.7 | 26.7 | 26.7 | 26.7 | 26.7 | 26.7 | 26.7 | 26.7 | 26.7 |
| | | | Total | | 61.7 | 61.7 | 61.7 | 61.7 | 61.7 | 61.7 | 61.7 | 61.7 | 61.7 | 61.7 | 61.7 |
| (c) or (c') | Latent Hardener | Acid-Modified Rosin | KE-604 | | 2 | 4 | 6 | 10 | 12 | 18 | 22 | 10 | 10 | | |
| | | Basic Latent Hardener (in parentheses, part(s) by weight of a latent hardener) | HXA-3941HP | | 40 (13.3) | 40 (13.3) | 40 (13.3) | 40 (13.3) | 40 (13.3) | 40 (13.3) | 40 (13.3) | 40 (13.3) | 40 (13.3) | 40 (13.3) | 40 (13.3) |
| (d) | Inorganic particle Spherical Silica | | SO-E2 | | 155 | 155 | 155 | 155 | 155 | 155 | 155 | 30 | 500 | 155 | 155 |
| (e) | Hardening Agent Rosin | | KR-85 | | 50 | 50 | 50 | 50 | 50 | 50 | 50 | 50 | 50 | 50 | 10 |
| (f) | Solvent | | MIBK | | 3 | 6 | 10 | 16 | 19 | 29 | 36 | 16 | 16 | 0 | 0 |
| Parts by Weight of Acid-Modified Rosin (with respect to 100 parts by weight of epoxy compound) | | | | | 60 | 60 | 59 | 58 | 58 | 57 | 56 | 21 | 82 | 61 | 58 |
| Content of Inorganic Particles (% by mass) | | | | | | | | | | | | | | | |
| Display Test of Liquid Crystal Panel | Immediately after Adhesive Agent Preparation | | | | B | A | A | A | A | B | B | A | A | B | B |
| | | | | | A | A | A | A | A | A | A | A | A | A | A |
| | Adhesive Agent under Circumstance of 23° C. and 55% in RH After Reliability Test (1000 cycle) | | | | C | A | A | A | A | A | C | C | C | C | C |
| | After Reliability Test (2000 cycle) | | | | | | | | | | | | | | |
| | Adhesive Agent under Circumstance of 23° C. and 55% in RH After Lapse of 1 Month | Before Reliability Test | | | B | A | A | A | A | B | B | B | B | C | C |
| | | After Reliability Test (1000 cycle) | | | A | A | A | A | A | A | A | A | A | C | C |
| | | After Reliability Test (2000 cycle) | | | C | A | A | A | A | A | C | C | C | C | C |
| | Adhesive Agent under Circumstance of 23° C. and 55% in RH After Lapse of 3 Months | Before Reliability Test | | | B | A | A | A | A | B | B | B | B | C | C |
| | | After Reliability Test (1000 cycle) | | | A | A | A | A | A | A | A | C | C | C | C |
| | | After Reliability Test (2000 cycle) | | | C | A | A | A | A | A | C | C | C | C | C |
| Melt Viscosity Evaluation | Adhesive Agent under Circumstance of 23° C. and 55% in RH After Lapse of 1 Month | | | | A | A | A | A | A | A | A | A | A | C | C |
| | Adhesive Agent under Circumstance of 23° C. and 55% in RH After Lapse of 3 Months | | | | A | A | A | A | A | A | A | A | A | C | C |

From the result of comparison between Examples 1 to 30 and Comparative Examples 1 to 8, it is found that the adhesive agent not containing acid-modified rosin has low storage life, and therefore connection reliability cannot be obtained at all when the adhesive agent films, the tape rolls of which were stored for 1 month or 3 months under the circumstance of 23° C. and 55% in RH, were used. Further, it is found that when the adhesive agent contains inorganic particle, connection reliability is maintained even when the adhesive agent is subjected to a moisture absorption-reflow process and a thermal cycle process.

Examples 31 to 46 and Comparative Examples 9 to 12

Adhesive agents were prepared and evaluated in the same manner as in Examples 8 to 14, 22 to 30 and Comparative Examples 3, 4, 7 and 8 except that the organic-solvent-soluble polyimide B was changed to the organic-solvent-soluble polyimide C, and consequently, evaluation results similar to those of the display test of liquid crystal panels of Examples 8 to 14, 22 to 30 and Comparative Examples 3, 4, 7 and 8 were obtained.

Examples 47 to 76

Adhesive agents for semiconductor were prepared and evaluated in the same manner as in Examples 1 to 30 except that the acid-modified rosin KE-604 of a latent hardener was changed to the acid-modified rosin KR-120, and consequently, evaluation results similar to those of the display test of liquid crystal panels of Examples 1 to 30 were obtained.

Examples 77 to 83 and Comparative Examples 13 and 14

Adhesive agents were prepared in the same manner as in Example 1 by mixing the components (a) to (f) shown in Table 5 so as to be in compounding ratios shown in Table 5 and evaluated, and consequently, evaluation results of the display test of liquid crystal panels shown in Table 5 were obtained.

TABLE 5

| | | | | | Example | | | | | | | Comparative Example | |
|---|---|---|---|---|---|---|---|---|---|---|---|---|---|
| | | | | 77 | 78 | 79 | 80 | 81 | 82 | 83 | 13 | 14 |
| Composition of Adhesive Agent (part(s) by mass) | (a) | Polyimide | Polyimide D | 25 | 25 | 25 | 25 | 25 | 25 | 25 | 25 | 25 |
| | (b) | Epoxy Compound not having functional group | N865 | 30 | 30 | 30 | 30 | 30 | 30 | 30 | 30 | 30 |
| | | Solid Epoxy Compound | YL980 | 5 | 5 | 5 | 5 | 5 | 5 | 5 | 5 | 5 |
| | | Liquid Epoxy Compound | | 26.7 | 26.7 | 26.7 | 26.7 | 26.7 | 26.7 | 26.7 | 26.7 | 26.7 |
| | | Total | | 61.7 | 61.7 | 61.7 | 61.7 | 61.7 | 61.7 | 61.7 | 61.7 | 61.7 |
| | (c) or (c') | Latent Hardener | Acid-Modified Rosin | 2 | 4 | 6 | 10 | 12 | 18 | 22 | | |
| | | | Basic Latent Hardener HXA-3941HP | 40 | 40 | 40 | 40 | 40 | 40 | 40 | 40 | 40 |
| | | | Parts by Mass Contained in (c) (in parentheses, part(s) by mass of a latent hardener) | (13.3) | (13.3) | (13.3) | (13.3) | (13.3) | (13.3) | (13.3) | (13.3) | (13.3) |
| | (d) | Inorganic particle | Spherical Silica SO-E2 | 155 | 155 | 155 | 155 | 155 | 155 | 155 | 155 | 155 |
| | (e) | Hardening Agent | Rosin KR-85 | | | | | | | | | 10 |
| | (f) | Solvent | MIBK | 50 | 50 | 50 | 50 | 50 | 50 | 50 | 50 | 50 |
| Parts by Mass of Acid-Modified Rosin (with respect to 100 parts by mass of epoxy compound) | | | | 3 | 6 | 10 | 16 | 19 | 29 | 36 | 0 | 0 |
| Content of Inorganic Particles (% by mass) | | | | 60 | 60 | 59 | 58 | 58 | 57 | 56 | 61 | 58 |
| Display Test of Liquid Crystal Panel | | | Immediately after Adhesive Agent Preparation | B | B | B | B | B | B | B | B | B |
| | | | | A | A | A | A | A | A | A | C | C |
| | | | Before Reliability Test | C | B | B | B | B | A | C | C | C |
| | | | After Reliability Test (1000 cycle) | B | B | B | B | B | B | B | C | C |
| | | | After Reliability Test (2000 cycle) | C | A | A | A | A | A | C | C | C |
| | | | Before Reliability Test | C | C | C | C | C | C | C | C | C |
| | | | Adhesive Agent under Circumstance of 23° C. and 55% in RH After Lapse of 1 Month | B | B | B | B | B | B | B | C | C |
| | | | After Reliability Test (1000 cycle) | C | A | A | A | A | A | C | C | C |
| | | | Adhesive Agent under Circumstance of 23° C. and 55% in RH After Lapse of 3 Months | C | C | C | C | C | C | C | C | C |
| | | | After Reliability Test (2000 cycle) | | | | | | | | | |
| Melt Viscosity Evaluation | | | Adhesive Agent under Circumstance of 23° C. and 55% in RH After Lapse of 1 Month | A | A | A | A | A | A | A | C | C |
| | | | Adhesive Agent under Circumstance of 23° C. and 55% in RH After Lapse of 3 Months | A | A | A | A | A | A | A | C | C |

INDUSTRIAL APPLICABILITY

The adhesive agent of the present invention can be used as an adhesive agent for use in bonding between electronic parts for use in personal computers or personal digital assistance, or a radiator plate and a printed substrate or a flexible substrate, or in bonding between substrates. Further, the adhesive agent of the present invention can be suitably used as an adhesive agent for semiconductor in bonding or direct electrical connection of a semiconductor chip such as LSI, LED or laser diode to a circuit board such as a flexible substrate, a glass epoxy substrate, a glass substrate, or a ceramic substrate.

The invention claimed is:

1. An adhesive agent film which comprises an adhesive agent comprising:
   a polyimide (a), an epoxy compound (b), and an acid-modified rosin (c),
   wherein the polyimide (a) is a polymer having a structure represented by a general formula (2) or a general formula (3) and containing a structure represented by a general formula (1) as $R^4$ in the general formula (2) or the general formula (3) in an amount of 5 to 15% by mass with respect to the total amount of the polymer:

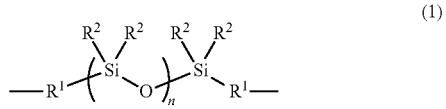

in which $R^1$s represent a divalent hydrocarbon group, and may be the same or different in one molecule and may be the same or different in different molecules, $R^2$s represent a monovalent hydrocarbon group, and may be the same or different in one molecule and may be the same or different in different molecules, and n is an integer of 1 to 10;

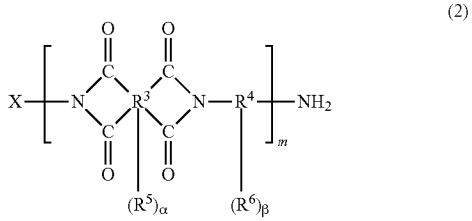

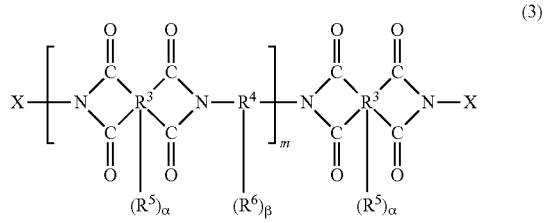

in which $R^3$s are a 4- to 14-valent organic group, and may be the same or different in one molecule and may be the same or different in different molecules; $R^4$s are a 2- to 12-valent organic group, and may be the same or different in one molecule and may be the same or different in different molecules; at least one of $R^3$ and $R^4$ is an aromatic group containing at least one of one or more groups selected from the group consisting of a 1,1,1,3,3,3-hexafluoropropyl group, an isopropyl group, an ether group, a thioether group, and a $SO_2$ group; $R^5$s and $R^6$s represent one or more groups selected from the group consisting of a phenolic hydroxyl group, a sulfonic acid group, and a thiol group, and may be the same or different in one molecule and may be the same or different in different molecules; X represents a monovalent organic group; m represents an integer of 8 to 200; $\alpha$ and $\beta$ are each an integer of 0 to 10, and $\alpha+\beta$ is an integer of 0 to 10; and in which $\alpha+\beta$ is 1 to 10 in 20 to 90% of repeating units whose number is represented by m, wherein a minimum melt viscosity after stored for one month under an environment of 23° C. and 55% in relative humidity (RH) is 100 to 10000 Pa·s.

2. The adhesive agent according to claim 1, wherein the content of the acid-modified rosin (c) in the adhesive agent is 5 parts by mass or more and 30 parts by mass or less with respect to 100 parts by mass of the epoxy compound (b).

3. The adhesive agent according to claim 2 further containing inorganic particles (d), wherein the content of the inorganic particles (d) is 30 to 80% by mass with respect to the total amount of the components (a) to (d).

4. The adhesive agent according to claim 1 further containing inorganic particles (d), wherein the content of the inorganic particles (d) is 30 to 80% by mass with respect to the total amount of the components (a) to (d).

5. A semiconductor device including a hardened article of the adhesive agent according to claim 1.

6. A method for producing a semiconductor device, wherein the adhesive agent according to claim 1 is interposed between a first circuit member and a second circuit member; and the first circuit member and the second circuit member are electrically connected to each other through application of heat and pressure.

7. The adhesive agent according to claim 1, wherein the content of the acid-modified rosin (c) in the adhesive agent is 5 parts by mass or more and 30 parts by mass or less with respect to 100 parts by mass of the epoxy compound (b).

8. The adhesive agent according to claim 1 further containing inorganic particles (d), wherein the content of the inorganic particles (d) is 30 to 80% by mass with respect to the total amount of the components (a) to (d).

* * * * *